United States Patent
Enomoto et al.

(10) Patent No.: US 9,510,473 B2
(45) Date of Patent: Nov. 29, 2016

(54) DISPLAY DEVICE

(75) Inventors: Hiromi Enomoto, Osaka (JP); Yuhsuke Nii, Osaka (JP); Nobuhiko Akanuma, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 219 days.

(21) Appl. No.: 14/238,554

(22) PCT Filed: Sep. 11, 2012

(86) PCT No.: PCT/JP2012/005745
§ 371 (c)(1),
(2), (4) Date: Feb. 12, 2014

(87) PCT Pub. No.: WO2013/038653
PCT Pub. Date: Mar. 21, 2013

(65) Prior Publication Data
US 2014/0185251 A1    Jul. 3, 2014

(30) Foreign Application Priority Data

Sep. 15, 2011   (JP) ................. 2011-202301

(51) Int. Cl.
*H05K 7/02*    (2006.01)
*G09F 3/00*    (2006.01)
*G02F 1/1345*  (2006.01)

(52) U.S. Cl.
CPC ............ *H05K 7/02* (2013.01); *G02F 1/13452* (2013.01); *G09F 3/00* (2013.01)

(58) Field of Classification Search
CPC ........ G09F 3/00; G02F 1/13452; H05K 7/02

USPC .......................... 361/749, 760; 174/254–258
See application file for complete search history.

(56) References Cited

U.S. PATENT DOCUMENTS

| | | | |
|---|---|---|---|
| 2005/0018102 A1 | 1/2005 | Hirano | |
| 2005/0128717 A1* | 6/2005 | Chuang | ................. H05K 1/028 361/749 |

(Continued)

FOREIGN PATENT DOCUMENTS

| | | | |
|---|---|---|---|
| JP | 2005-017483 A | 1/2005 | |
| JP | 2005-317957 A | 11/2005 | |

(Continued)

OTHER PUBLICATIONS

Official Communication issued in International Patent Application No. PCT/JP2012/005745, mailed on Dec. 18, 2012.

*Primary Examiner* — Courtney Smith
*Assistant Examiner* — Jessey R Ervin
(74) *Attorney, Agent, or Firm* — Keating & Bennett, LLP

(57) ABSTRACT

A display device includes a panel laminated body including a panel laminated body including a plurality of panels stacked together, flexible printed circuit boards each being connected to a corresponding one of respective short sides of the plurality of panels disposed in one of side portions of the panel laminated body, and an extension portion formed in at least a part of the flexible printed circuit boards so as to extend outwardly from a side area of the panel laminated body in a short-side direction of the panels in the side area. At least a pair of the extension portions is electrically connected together in a state where the pair of the extension portions is superimposed on each other and is folded in the side area of the panel laminated body.

5 Claims, 17 Drawing Sheets

1

(56) References Cited

U.S. PATENT DOCUMENTS

| | | | |
|---|---|---|---|
| 2005/0195578 A1* | 9/2005 | Chang | G02F 1/13452 361/749 |
| 2005/0233611 A1 | 10/2005 | Sung et al. | |
| 2010/0060601 A1 | 3/2010 | Oohira | |
| 2012/0236167 A1* | 9/2012 | Takano | H05K 1/147 348/208.2 |

FOREIGN PATENT DOCUMENTS

| | | | |
|---|---|---|---|
| JP | 2006-098633 A | | 4/2006 |
| JP | 2007-171433 A | | 7/2007 |
| JP | 2007171433 A | * | 7/2007 |
| JP | 2010-061026 A | | 3/2010 |
| JP | 2012198336 A | * | 10/2012 |

* cited by examiner

DISPLAY DEVICE

TECHNICAL FIELD

The present disclosure relates to display devices.

BACKGROUND ART

In recent years, there have been an increasing demand for flat display devices (flat panel displays), such as, for example, a liquid crystal display device and the like, and flat display devices have been widely used for mobile devices, such as smart phones, mobile phones, and the like.

For example, a liquid crystal display device includes a back light unit serving as a light device and a liquid crystal display panel disposed so as to face the back light unit. The back light unit includes a light source, such as a light emitting diode (LED) and the like, and a flexible printed circuit board (FPC) for supplying a light source signal and the like to the light source. The liquid crystal display panel includes a TFT substrate on which a plurality of thin transistors (TFTs) are formed and an FPC for supplying a control signal to the TFT substrate. That is, each of the back light unit and the liquid crystal display panel includes an FPC.

Also, in recent years, the function of display devices is increased by superimposing not only a back light unit but also, for example, a so-called touch panel, a parallax barrier panel for performing a stereoscopic image display, and the like, on a liquid crystal display panel.

However, since each of the touch panel, the parallax barrier panel, and the like, includes an FPC and, normally, a connector is provided in each of the FPCs, not only a relatively large space has to be provided in order to dispose the connecters but also the component cost is increased because of the connectors themselves.

Patent Document 1 discloses that, in a display device which includes a liquid crystal display panel, a back light unit, and a touch panel, to a first FPC of the liquid crystal display panel, bonded are a second FPC of the touch panel and a third FPC of the back light unit by solder connection or anisotropic conductive film (ACF) connection. Thus, the connectors of the second and third FPCs are omitted and the connector of the first FPC is shared by the FPCs, thereby reducing the number of connectors and thus solving the problem relating to the space for connectors and the component cost.

CITATION LIST

Patent Document

PATENT DOCUMENT 1: Japanese Patent Application No. 2005-317957

SUMMARY OF THE INVENTION

Technical Problem

However, in the liquid crystal display device of Patent Document 1, while a base end side of the first FPC is connected to one of short sides of a rectangular liquid crystal display panel, the other end side of the first FPC greatly extends from the corresponding short side of the liquid crystal display panel in a long-side direction (that is, a direction perpendicular to the short side) of the liquid crystal display panel. Similar to the first FPC, each of the second and third FPCs extends from the short side in the long-side direction of the liquid crystal display panel, and is connected to the first FPC.

Therefore, in the liquid crystal display device of Patent Document 1, the three FPCs extending from the short side of the liquid crystal display panel in the long-side direction thereof have to be folded in a back-face side (that is, an opposite side to a user) of the liquid crystal display panel and be disposed in the folded state.

For this reason, in the above-described known display device, a plurality of FPCs are disposed on the back-face side of the display device, and thus, reduction in the thickness of the entire device is hampered. Specifically, in recent years, while a structure in which a plurality of function panels, such as a touch panel, a parallax barrier panel, and the like, are stacked on a display panel is demanded by consumers, the number of flexible printed circuit boards serving as FPCs is increased in the structure, and therefore, the problem in which reduction in the thickness of the entire device is hampered is noticeable.

In view of the foregoing, the present invention has been devised, and it is therefore an object or the invention to reduce the thickness of an entire device, whether or not the number of flexible printed circuit boards is increased.

Solution to the Problem

In order to achieve the above-described object, a display device according to the present disclosure includes a panel laminated body including a plurality of rectangular panels stacked together such that respective short sides of the plurality of panels extend in a same direction, flexible printed circuit boards each being connected to a corresponding one of respective short sides of the plurality of panels disposed in one of side portions of the panel laminated body, and an extension portion formed in at least a part of the flexible printed circuit boards so as to extend outwardly from a side area of the panel laminated body in a short-side direction of the panels in the side area 5. At least a pair of the extension portions is electrically connected together in a state where the pair of the extension portions is superimposed on each other and is folded in the side area of the panel laminated body.

In this structure, even when a display device includes a panel laminated body in which a plurality of rectangular panels each including a flexible printed circuit board are stacked together, an extension portion is formed in at least a part of the flexible printed circuit boards so as to extend outwardly from a side area of the panel laminated body in a short-side direction of the panels, and at least a pair of the extension portions is electrically connected together in a state where the pair of the extension portions is superimposed on each other and is folded in the side area of the panel laminated body, so that a plurality of flexible printed circuit boards may be compactly disposed in the side area of the panel laminated body so as not to be superimposed on the panel laminated body.

As a result, even when the number of the flexible printed circuit boards increases as the number of panels increases, the thickness of the entire device may be reduced. Furthermore, the plurality of flexible printed circuit boards are electrically connected together in the extension portions. Thus, the number of connectors may be reduced, and therefore, the space for connecters and the component cost may be greatly reduced.

The plurality of flexible printed circuit boards may include a main flexible printed circuit board including a connector, and at least one sub flexible printed circuit board which does not include a connector, and an extension portion of the sub flexible printed circuit board may be electrically connected to an extension portion of the main flexible printed circuit board.

In this structure, the extension portion of the sub flexible printed circuit board is connected to the extension portion of the main flexible printed circuit board, and thus, a connector of the sub flexible printed circuit board may be omitted and a single connector of the main flexible printed circuit board may be shared by the flexible printed circuit boards.

The display device may further include a substrate member stacked on the panel laminated body and including a side end portion protruding from the side area of the panel laminated body, and the folded extension portions of the flexible printed circuit boards may be disposed such that the extension portions as a whole superpose on the side end portion of the substrate member.

In this structure, the flexible printed circuit boards and the extension portions thereof may be arranged in an area in which the side end portion of the substrate member is disposed, and thus, the space may be effectively used.

A substrate member side flexible printed circuit board including a substrate member side extension portion extending outwardly from the side area of the panel laminated body in short-side direction of the panels may be provided in the side end portion of the substrate member, and the substrate member side extension portion may be electrically connected to the extension portions of the flexible printed circuit boards in a state where the substrate member side extension portion is superimposed on the extension portions, and is folded in the side area of the panel laminated body.

In this structure, not only for the flexible printed circuit boards in the panel laminated body, but also for the flexible printed circuit board provided in the substrate member, the extension portions are connected to each other, and thus, a circuit configuration may be provided in the side end portion of the substrate member while effectively using a space in the side area of the panel laminated body.

The extension portions of the flexible printed circuit boards may be formed such that each of base-end side portions of the extension portions is separated from the side portion of the panel laminated body in which the flexible printed circuit boards are provided with a more distance, as compared to a corresponding tip-end side portion thereof.

In this structure, the base-end side portions of the extension portions are separated from the side portion of the panel laminated body in a state before the extension portions of the flexible printed circuit boards are folded, and thus, in fabrication process steps for fabricating the display device, the side portion of the panel laminated body may be held in a simple manner.

An element may be provided in each of areas of the flexible printed circuit boards which are superimposed on the folded extension portions, and an insulating member may be interposed between the element and the folded extension portions.

In this structure, the insulating member is interposed between the elements of the flexible printed circuit boards and the folded extension portions, and thus, the elements may be electrically protected and be physically protected from contact by the extension portions.

The folded extension portions may be fixed to the flexible printed circuit boards by an insulating tape member which covers electrically connected portions of the extension portions.

In this structure, the electrically connected portions of the extension portions may be reliably protected by the insulating tape member and the extension portions may be fixed to the flexible printed circuit boards in a state where the extension portions are folded, and thus, the reliability of the display device may be increased.

Advantages of the Invention

According to the present invention, even when the display device includes a panel laminated body in which a plurality of panels each including a flexible printed circuit board are stacked together, an extension portion is formed in at least a part of the flexible printed circuit boards so as to extend outwardly from a side area of the panel laminated body in a short-side direction of the panels, and at least a pair of the extension portions is electrically connected together in a state where the pair of the extension portions is superimposed on each other and is folded in the side area of the panel laminated body, so that a plurality of flexible printed circuit boards may be compactly disposed in the side area of the panel laminated body so as not to be superimposed on the panel laminated body. As a result, even when the number of the flexible printed circuit boards increases as the number of panels increases, the thickness of the entire device may be reduced. Furthermore, the plurality of flexible printed circuit boards are electrically connected together in the extension portions. Thus, the number of connectors may be reduced, and therefore, the space for connecters and the component cost may be greatly reduced.

DESCRIPTION OF EMBODIMENTS

Embodiments will be hereinafter described in detail with reference to the accompanying drawings. Note that the present disclosure is not limited to the following embodiments.

First Embodiment

FIGS. 1-17 illustrate a first embodiment.

Figure 1:
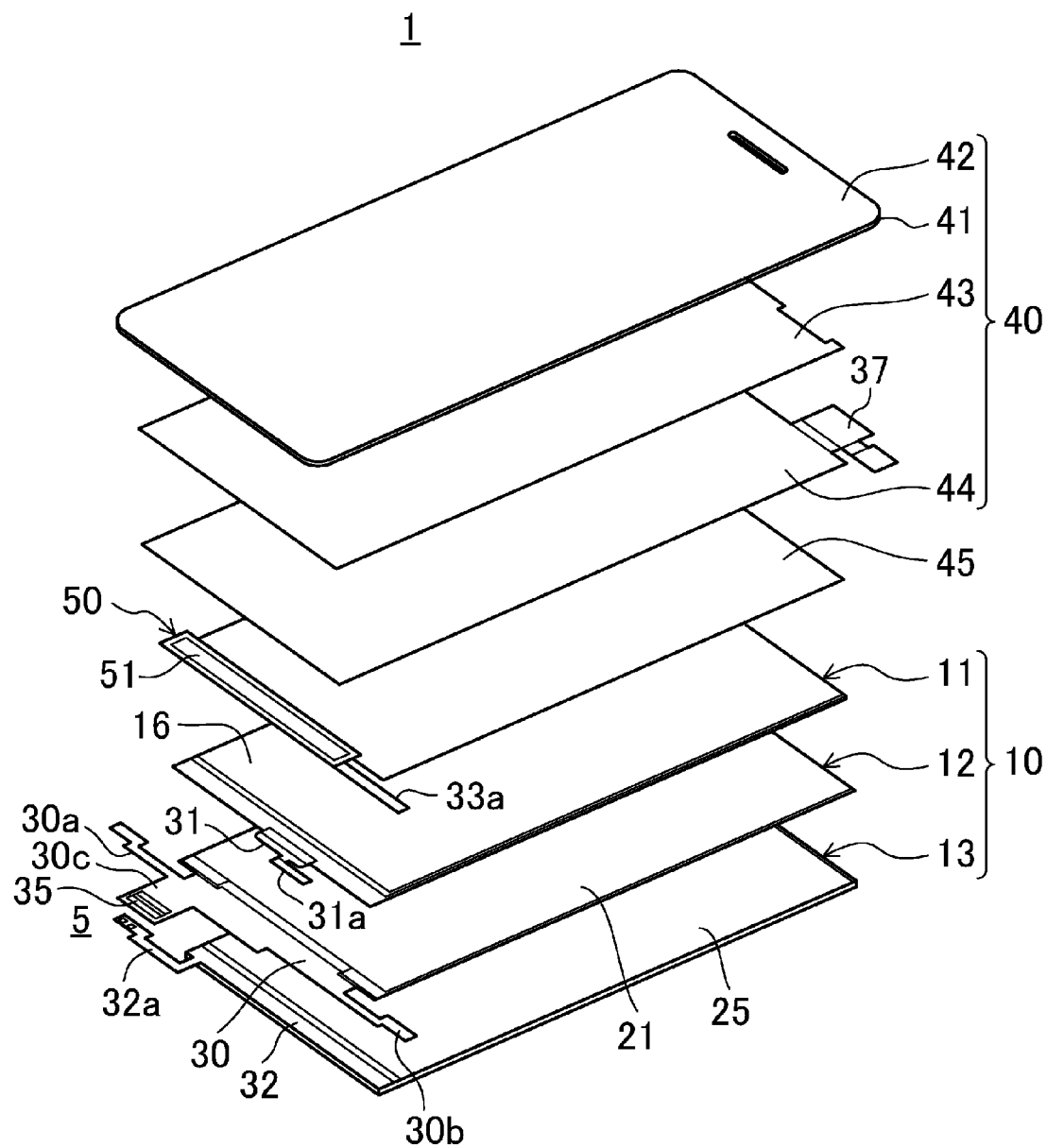
FIG. 1 is a perspective view illustrating a structure of a major part of a liquid crystal display device according to a first embodiment.
Figure 2:
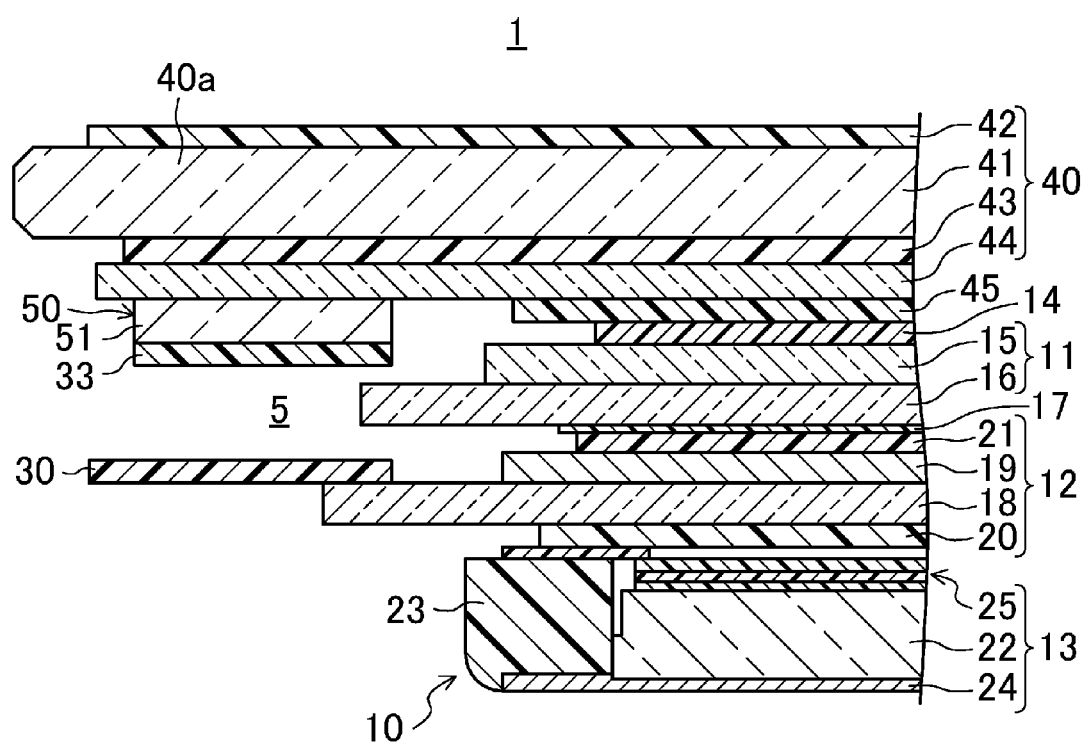
FIG. 2 is an enlarged cross-sectional view illustrating a side portion of the liquid crystal display device.

FIG. 1 is a perspective view illustrating a structure of a major part of a liquid crystal display device 1 according to a first embodiment. FIG. 2 is an enlarged cross-sectional view illustrating a side portion of the liquid crystal display device 1.

Figure 14:
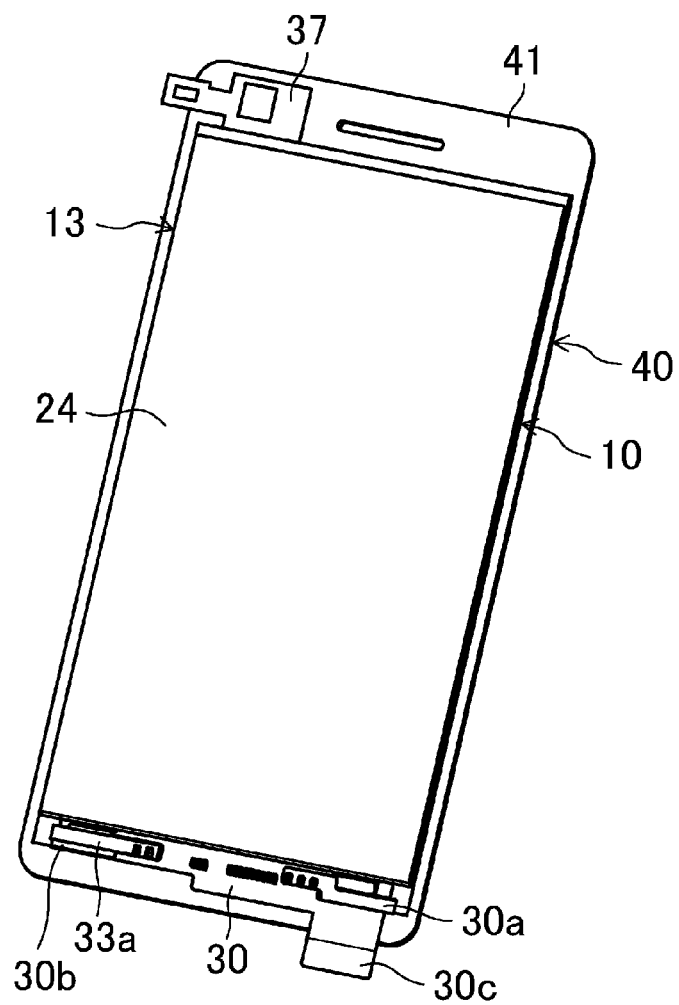
FIG. 14 is a perspective view illustrating folded extension portions.
Figure 15:
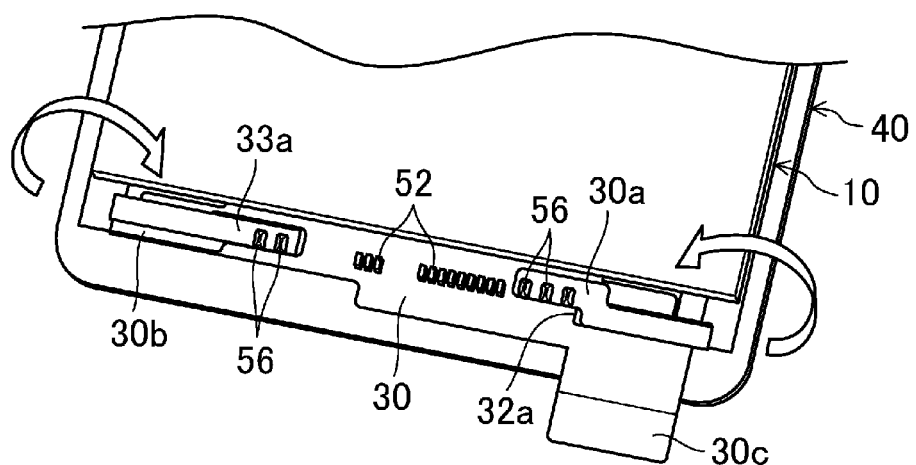
FIG. 15 is a perspective view illustrating a liquid crystal display device in which extension portions are folded.
Figure 16:
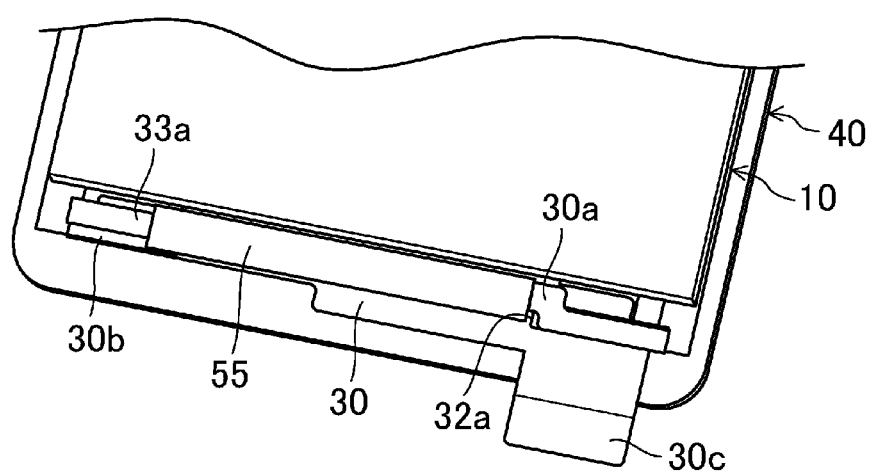
FIG. 16 is a perspective view illustrating an insulating tape member which fixes extension portions.
Figure 17:
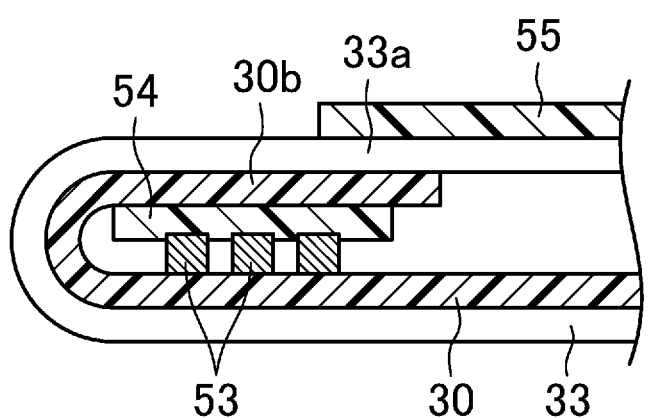
FIG. 17 is an enlarged perspective view illustrating folded extension portions.

FIG. 14 is a perspective view illustrating folded extension portions 30a, 30b, 32a, and 33a. FIG. 15 is a perspective view illustrating the liquid crystal display device 1 in which the extension portions 30a, 30b, 32a, and 33a are folded. FIG. 16 is a perspective view illustrating an insulating tape member 55 which fixes the extension portions 30a, 30b, 32a, and 33a. FIG. 17 is an enlarged cross-sectional view illustrating the folded extension portions 30b and 33a.

In this embodiment, the liquid crystal display device 1 will be described as an example display device according to the present disclosure. The liquid crystal display device 1 forms, for example, a display unit of a smart phone. As illustrated in FIG. 1 and FIG. 2, the liquid crystal display device 1 includes a panel laminated body 10 and a substrate member 40 stacked on the panel laminated body 10.

Panel Laminated Body

The panel laminated body 10 includes a plurality of rectangular panels 11, 12, and 13 which are stacked together such that respective short sides of the rectangular panels 11, 12, and 13 extend in the same direction. The plurality of panels 11, 12, and 13 are an SW panel 11 serving as a parallax barrier panel for switching between a flat (2D) display and a stereoscopic (3D) display, a liquid crystal display panel 12 disposed so as to face the SW panel 11, and a back light unit 13 serving as a light device disposed on an opposite side of the liquid crystal display panel 12 to a side thereof which faces the SW panel 11.

As illustrated in FIG. 1, each of FPCs 30, 31, and 32, serving as flexible printed circuit boards, is connected to a corresponding one of respective short sides of the rectangular panels 11, 12, and 13 arranged in one of side portions of the panel laminated body 10.

The FPC 30, 31, and 32 are a main FPC 30 serving as a single main flexible printed circuit board including a connector 35, and first sub FPC 31 and a second FPC 32 each serving as at least one sub flexible printed circuit board which does not include a connector.

Liquid Crystal Display Panel

As illustrated in FIG. 2, the liquid crystal display panel 12 includes a TFT substrate 18 in which a plurality of TFTs (not illustrated) serving as switching elements are formed, an opposing substrate 19 disposed so as to face the TFT substrate 18, and a liquid crystal layer (not illustrated) sealed between the TFT substrate 18 and the opposing substrate 19. A polarization plate 20 is attached to an opposite surface of the TFT substrate 18 to a surface thereof which faces the opposing substrate 19. A polarization plate 21 is attached to an opposite surface of the opposing substrate 19 to a surface thereof which faces the TFT substrate 18.

The TFT substrate 18 includes a short-side area which does not face the opposing substrate 19, and the main FPC 30 is connected to the short-side area. As illustrated in FIG. 1, the FPC 30 includes a first extension portion 30a and a second extension portion 30b each of which extends outwardly from a side area 5 of the panel laminated body 10 in a short-side direction of the liquid crystal display panel 12 in the side area 5.

As illustrated in FIG. 1, respective tip ends of each of the extension portions 30a and 30b extend outwardly from both sides of the liquid crystal display panel 12 in the short-side direction of the liquid crystal display panel 12 such that the tip ends extend in opposite directions. Also, each of the extension portions 30a and 30b is formed to have a crank shape such that each of respective base-end side portions of the extension portions 30a and 30b is separated from the side portion of the panel laminated body 10 in which the main FPC 30 is provided with a more distance, as compared to a corresponding one of respective tip-end side portions of the extension portions 30a and 30b.

Furthermore, the main FPC 30 includes a tip end portion 30c which protrudes in a long-side direction of the liquid crystal display panel 12 in the side area 5 of the panel laminated body 10. The connector 35 including a connection terminal is provided in the tip end portion 30c.

SW Panel

As illustrated in FIG. 2, the SW panel 11 includes a pair of transparent substrates, that is, an upper side substrate 15 and a lower side substrate 16. A polarization surface 14 is attached to an opposite surface of the upper side substrate 15 to a surface thereof which faces the lower side substrate 16. Then, the pair of the upper side substrate 15 and the lower side substrate 16 are attached to the liquid crystal display panel 12 with a resin layer 17 of a UV cured resin or the like interposed therebetween.

The first sub FPC 31 serving as a first sub flexible printed circuit board is connected to a center area of one of short sides of the SW panel 11. As illustrated in FIG. 1, the first sub FPC 31 includes a tip end portion 31a extending in a short-side direction of the SW panel 11. The tip end portion 31a is disposed in the side area 5 of the panel laminated body 10 and is electrically connected to the main FPC 30 by soldering, or the like.

Back Light Unit

As illustrated in FIG. 2, the back light unit 13 is disposed on an opposite side of the liquid crystal display panel 12 to a side thereof which faces the SW panel 11. The back light unit 13 includes a light guide plate 22 having a rectangular plate shape, a plurality of LEDs (not illustrated), serving as light sources, disposed on side surfaces of the light guide plate 22 to face one another, a plurality of optical sheets 25 provided on a side of the light guide plate 22, which faces the SW panel 11, and a reflection plate 24 provided on an opposite side of the light guide plate 22 to the side on which the optical sheets 25 are provided. The light guide plate 22, the LEDs, the optical sheets 25, and the reflection plate 24 are held by a frame 23 made of resin. Thus, the back light unit 13 as a whole is formed to have a rectangular plate shape.

The second sub FPC 32 serving as a second sub flexible printed circuit board is connected to a short side of the back light unit 13. As illustrated in FIG. 1, the second sub FPC 32 includes a fourth extension portion 32a which extends outwardly from the side area 5 of the panel laminated body 10 in a short-side direction of the back light unit 13. In a state where the fourth extension portion 32a is superimposed on the first extension portion 30a of the main FPC 30, the fourth extension portion 32a is electrically connected to the first extension portion 30a by soldering or the like and, as illustrated in FIG. 14 and FIG. 15, is folded in the side area 5 of the panel laminated body 10.

Substrate Member

As illustrated in FIG. 1, the substrate member 40 includes a cover substrate 41 to which a protective film 42 is attached and a touch panel 44 attached to the cover substrate 41 with a resin film 43 interposed therebetween. The substrate member 40 is attached to the SW panel 11 of the panel laminated body 10 with a resin film 45 interposed therebetween such that a side of the substrate member 40 on which the touch panel 44 is provided faces the SW panel 11.

The cover substrate 41 is made of, for example, a glass substrate or the like. An FPC 37 used for transmitting a control signal and the like to the touch panel 44 is connected to a short side of the touch panel 44 located at an opposite side to a side in which the side area 5 of the panel laminated body 10 is provided.

As illustrated in FIG. 2, the substrate member 40 includes a side end portion 40a protruding beyond the panel laminated body 10 in the side in which the side area 5 of the panel laminated body 10 is provided. The side end portion 40a includes a short-side area of each of the cover substrate 41 and the touch panel 44. A light shielding film (not illustrated) is formed on the cover substrate 41 of the side end portion 40a, and a plurality of icons (not illustrated) used for operating the liquid crystal display device 1 are formed by a pattern which transmits light.

Light Source Unit

As illustrated in FIG. 2, a light source unit 50 is provided in the side end portion 40a of the substrate member 40. The light source unit 50 is a light source used for supplying light to the plurality of icons, and is attached to an opposite surface of the touch panel 44 to a surface thereof which faces the cover substrate 41.

The light source unit 50 includes a light guide plate 51 extending in a short-side direction of the substrate member 40 and having a strip shape, an LED (not illustrated) disposed at a side of the light guide plate 51, and a third sub FPC 33 serving as a substrate member side flexible printed circuit board connected to the LED. That is, while the first and second sub FPCs 31 and 32 are provided in a side portion of the panel laminated body 10, the third sub FPC 33 is provided in the side end portion 40a of the substrate member 40.

As illustrated in FIG. 1, the third sub FPC 33 includes a third extension portion 33a serving as a substrate member side extension portion which extends outwardly from the side area 5 of the panel laminated body 10 in a short-side direction of the substrate member 40 in the side area 5. The third extension portion 33a is superimposed on the second extension portion 30b of the main FPC 30.

As illustrated in FIG. 14 and FIG. 15, in a state where the third extension portion 33a of the third sub FPC 33 is superimposed on the second extension portion 30b of the main FPC 30, the third extension portion 33a is electrically connected to the second extension portion 30b by soldering or the like, and is folded in the side area 5 of the panel laminated body 10.

Furthermore, as illustrated in FIG. 17, an element 53, such as a capacitor, and the like, is provided in an area of the main FPC 30 in which the folded second and third extension portions 30b and 33b are superimposed on each other. An insulating sheet 54 serving as an insulating member is interposed between the element 53 and the folded second and third extension portions 30b and the 33a.

As illustrated in FIG. 16, the first to fourth extension portions 30a, 30b, 32a, and 33a are fixed to the main FPC 30 by the insulating tape member 55 which covers electrically connected portions 56 soldered or the like in the extension portions 30a, 30b, 32a, and 33a, and the element 53 formed in the main FPC 30.

Thus, the folded second and third extension portions 30b and 33a and the folded first and fourth extension portions 30a and 32a are disposed such that the extension portions 30a, 30b, 32a, and 33a as a whole are entirely superposed on the side end portion 40a of the substrate member 40. That is, all of the extension portions 30a, 30b, 32a, and 33a is efficiently disposed in a space which corresponds to the side area 5 of the panel laminated body 10 and is superimposed on the side end portion 40a of the substrate member 40.

Thus, the liquid crystal display device 1 is configured such that control signals of a plurality of types are input and output from and to the connector 35 of the main FPC 30 to thereby control all of the back light unit 13, the liquid crystal display panel 12, the SW panel 11, and the light source unit 50.

That is, a control signal and the like are supplied to the back light unit 13 from the connector 35 through the main FPC 30 and the second sub FPC 32. Also, a control signal and the like are supplied to the liquid crystal display panel 12 from the connector 35 through the main FPC 30. A control signal and the like are supplied to the SW panel 11 through the main FPC 30 and the first sub FPC 31. Furthermore, a control signal and the like are supplied to the light source unit 50 from the connector 35 through the main FPC 30 and the third sub FPC 33.

Thus, the light source unit 50 is controlled separately and independently from the back light unit 13 and supplies light to the icons formed in the side end portion 40a of the substrate member 40 to light and display the icons. When a user touches one of the icons which are lit and displayed, a touch position of the user then is detected by the touch panel.

Fabrication Method

Next, a method for fabricating the liquid crystal display device 1 will be described.

Figure 3:
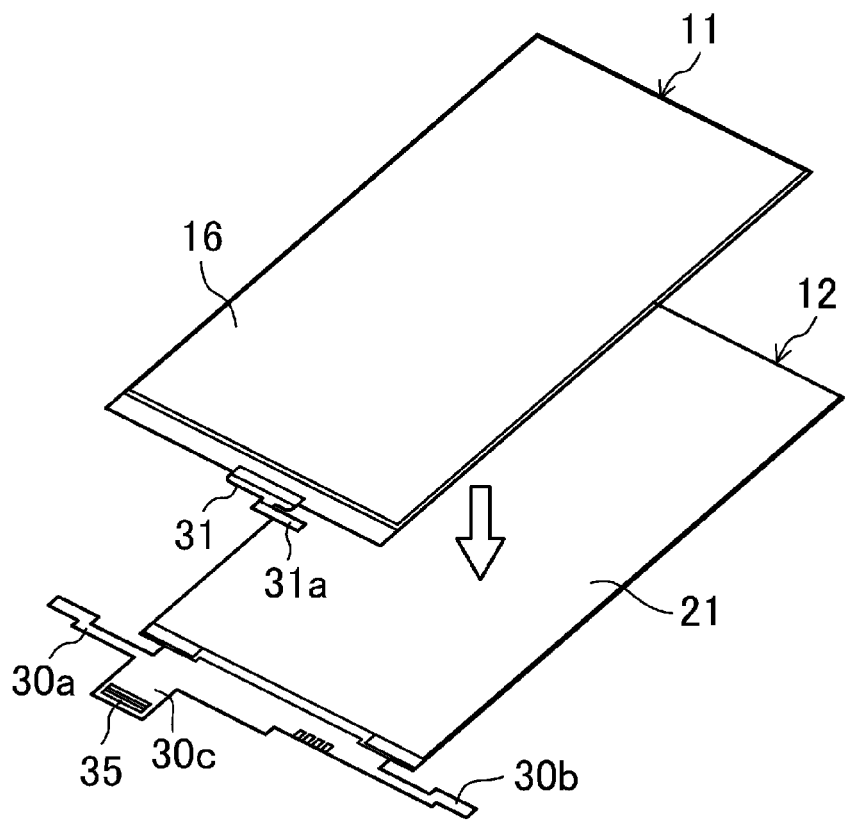
FIG. 3 is a perspective view illustrating an SW panel and a liquid crystal display panel.
Figure 4:
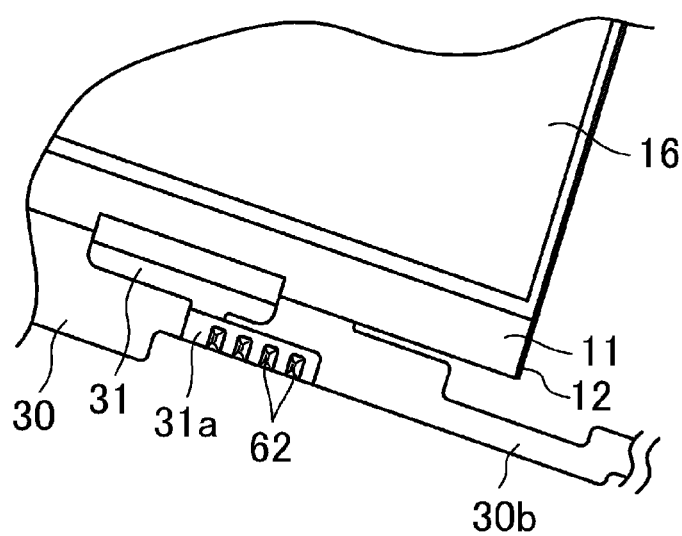
FIG. 4 is an enlarged perspective view illustrating an FPC of an SW panel connected to an FPC of a liquid crystal display panel.

FIG. 3 is a perspective view illustrating the SW panel 11 and the liquid crystal display panel 12. FIG. 4 is an enlarged perspective view illustrating the FPC 31 of the SW panel 11 connected to the FPC 30 of the liquid crystal display panel 12.

Figure 5:
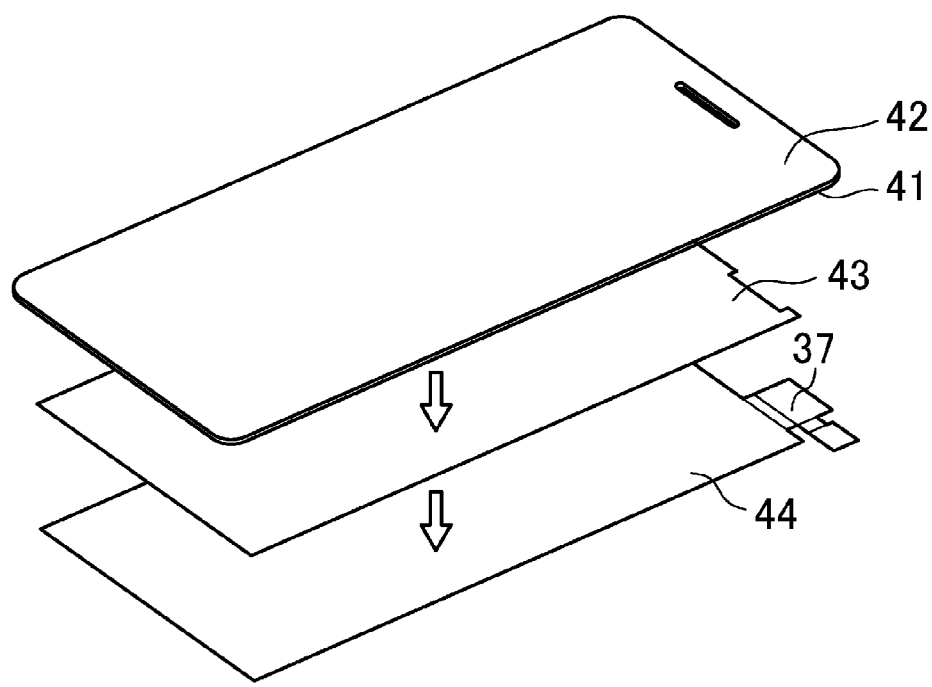
FIG. 5 is a perspective view illustrating a cover substrate, a resin film, and a touch panel.
Figure 6:
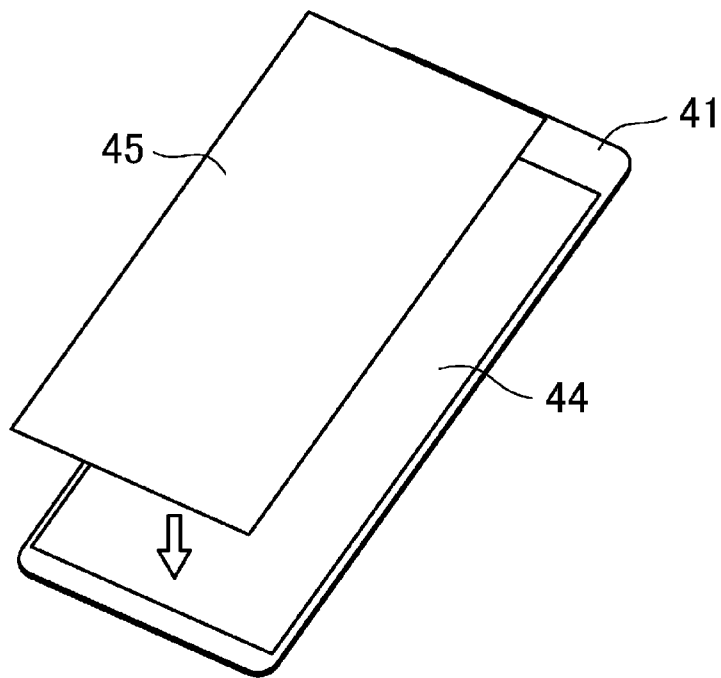
FIG. 6 is a perspective view illustrating a resin film to be attached to a touch panel.
Figure 7:
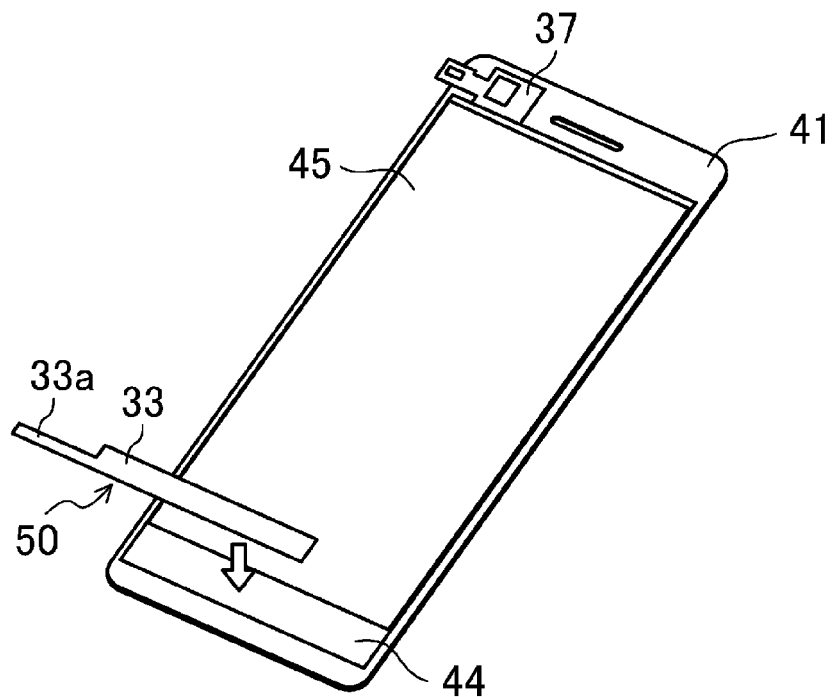
FIG. 7 is a perspective view illustrating a third sub FPC and a cover substrate.
Figure 8:
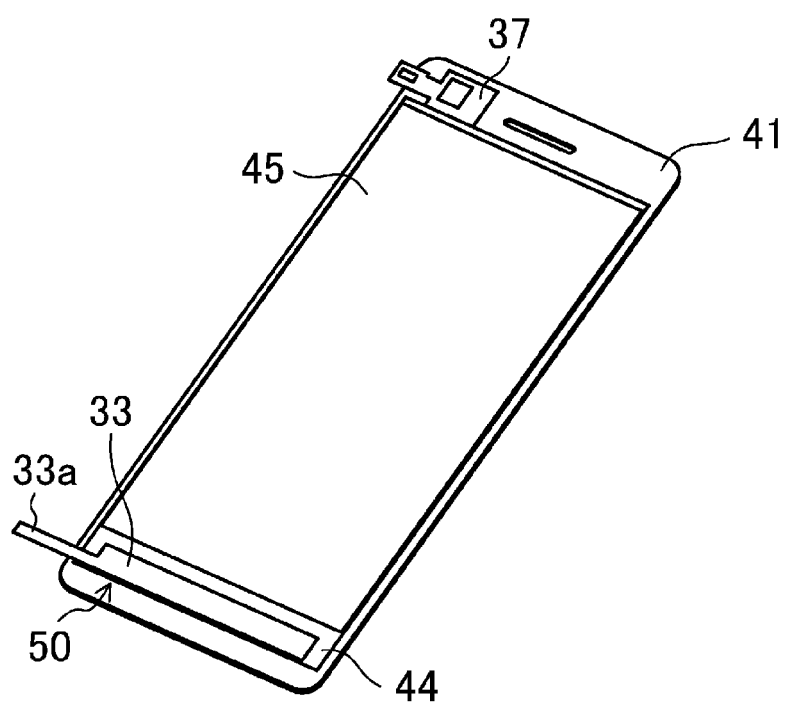
FIG. 8 is a perspective view illustrating a third sub FPC attached to a cover substrate.
Figure 9:
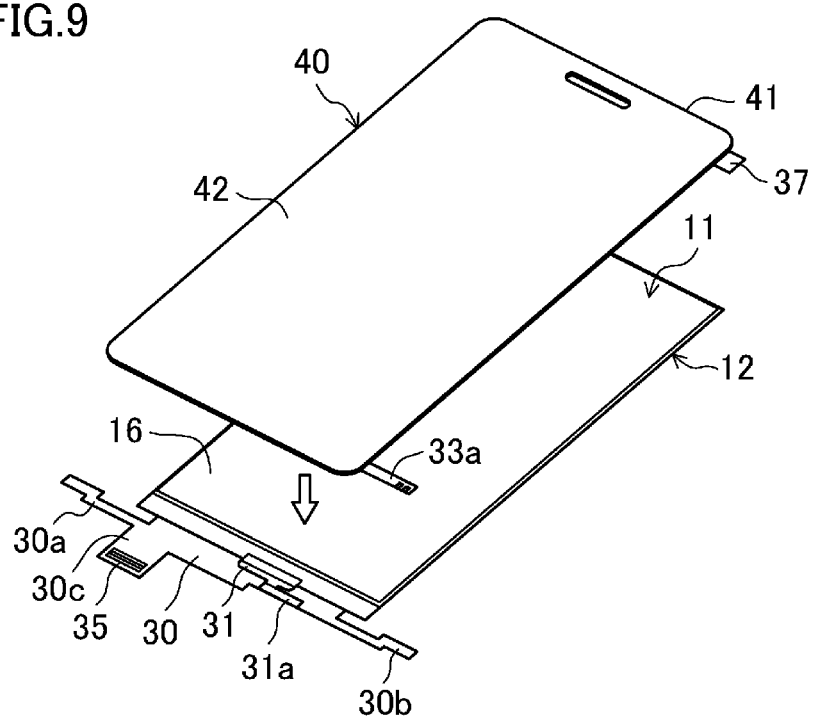
FIG. 9 is a perspective view illustrating a substrate member, an SW panel, and a liquid crystal display panel.

FIG. 5 is a perspective view illustrating the cover substrate 41, the resin film 43, and the touch panel 44. FIG. 6 is a perspective view illustrating the resin film 45 to be attached to the touch panel 44. FIG. 7 is a perspective view illustrating the third sub FPC 33 and the cover substrate 41. FIG. 8 is a perspective view illustrating the third sub FPC 33 attached to the cover substrate 41. FIG. 9 is a perspective view illustrating the substrate member 40, the SW panel 11, and the liquid crystal display panel 12.

Figure 10:
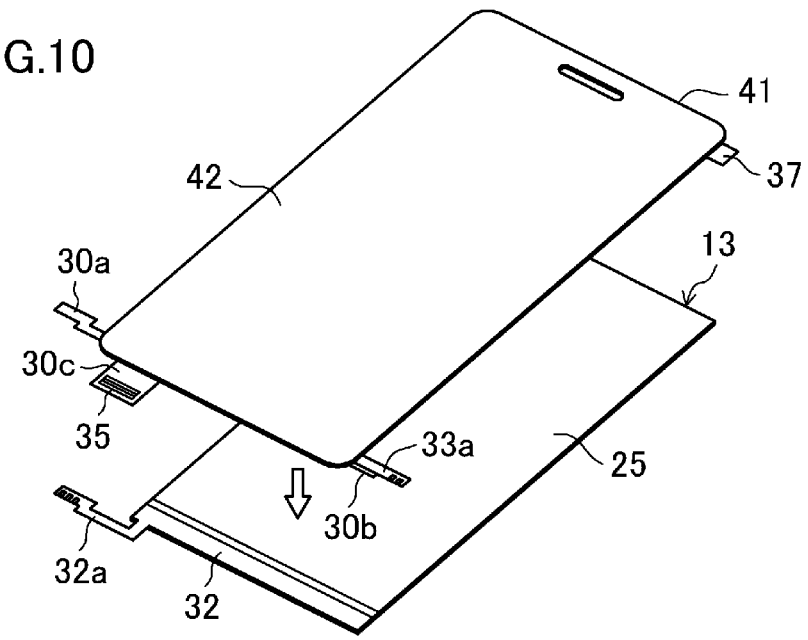
FIG. 10 is a perspective view illustrating a substrate member on which an SW panel and a liquid crystal display panel are superimposed, and a back light unit.
Figure 11:
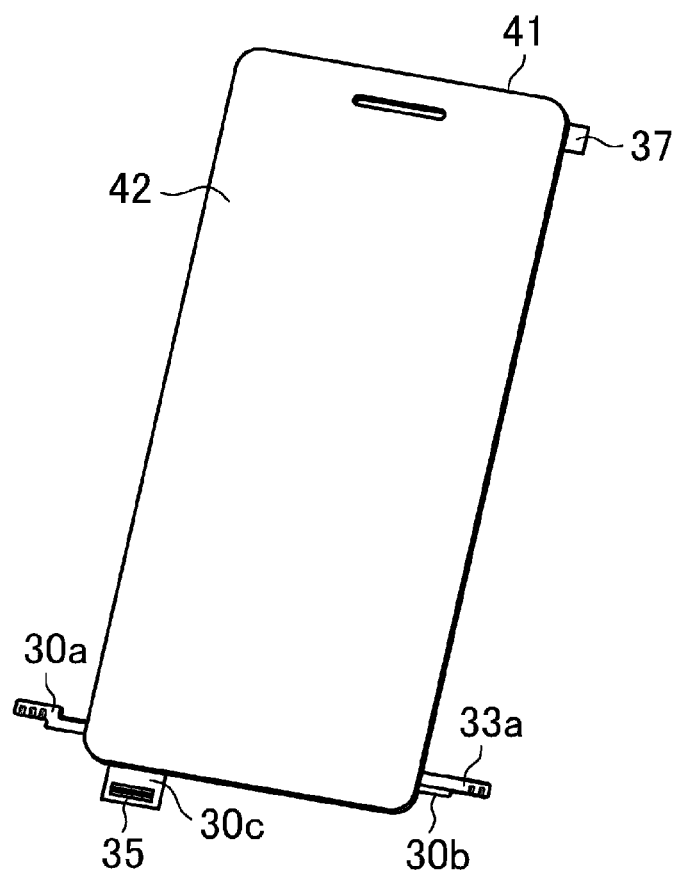
FIG. 11 is a perspective view illustrating a substrate member on which a back light unit is superimposed.
Figure 12:
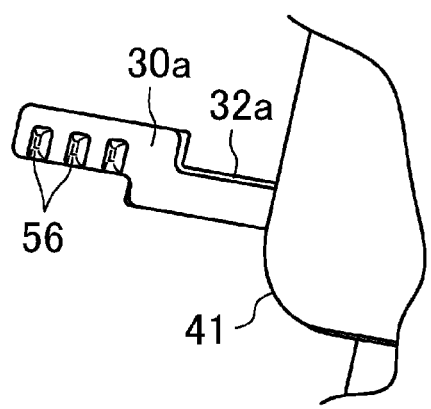
FIG. 12 is an enlarged perspective view illustrating first and fourth extension portions connected to each other.
Figure 13:
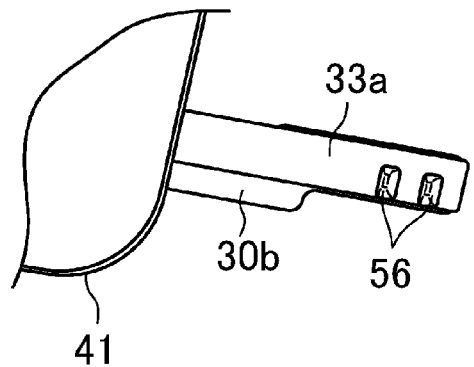
FIG. 13 is an enlarged perspective view illustrating second and third extension portions connected to each other.

FIG. 10 is a perspective view illustrating the substrate member 40 on which the SW panel 11 and the liquid crystal display panel 12 are superimposed, and the back light unit 13. FIG. 11 is a perspective view illustrating the substrate member 40 on which the back light unit 13 is superimposed. FIG. 12 is an enlarged perspective view illustrating the first and fourth extension portions 30a and 32a connected to each other. FIG. 13 is an enlarged perspective view illustrating the second and third extension portions 30b and 33a connected to each other.

First, as illustrated in FIG. 3, the SW panel 11 to which the first sub FPC 31 is connected is attached to the liquid crystal display panel 12 to which the main FPC 30 is connected. In this attaching process, for example, a UV cured resin is applied to a surface of the liquid crystal display panel 12 or the SW panel 11 and the SW panel 11 and the liquid crystal display panel 12 are disposed such that the first sub FPC 31 of the SW panel 11 faces the main FPC 30 of the liquid crystal display panel 12. Then, in a vacuum environment, after the SW panel 11 is attached to the liquid crystal display panel 12, the UV cured resin is irradiated with ultraviolet light, thereby causing the UV cured resin to cure.

Subsequently, as illustrated in FIG. 4, the tip end portion 31a of the first sub FPC 31, located in the SW panel 11, is electrically connected to the main FPC 30 by soldering or the like. Thus, a connection portion 62 is formed by soldering or the like in the main FPC 30 and the first sub FPC 31.

As illustrated in FIG. 5, the cover substrate 41 and the touch panel 44 are attached with each other with the resin film 43 interposed therebetween. The protective film 42 is attached to the cover substrate 41 in advance. Next, as illustrated in FIG. 6, the resin film 45 is attached to the touch panel 44 which has been attached to the cover substrate 41. The resin film 45 is shorter than the touch panel 44 in a long-side direction of the resin film 45. Therefore, as illustrated in FIG. 7, in an area of the substrate member 40 serving as the side end portion 40a, one of short-side areas of the touch panel 44 is exposed from the resin film 45. Thereafter, as illustrated in FIG. 8, the light source unit 50 is attached to the exposed area of the touch panel 44 from the resin film 45. Thus, the substrate member 40 is formed.

Next, as illustrated in FIG. 9, the substrate member 40 is disposed so as to face the SW panel 11 attached to the liquid crystal display panel 12. In this attaching process, the substrate member 40 is disposed such that the third extension portion 33a of the third sub FPC 33, located in the light source unit 50, faces the second extension portion 30b of the main FPC 30. Then, in a vacuum environment, the substrate member 40 and the SW panel 11 are attached to each other by, for example, UV cured resin or the like.

Next, as illustrated in FIG. 10, the SW panel 11 and the liquid crystal display panel 12 which are attached to the substrate member 40 and the back light unit 13 to which the second sub FPC 32 is connected are attached to each other. In this attaching process, the back light unit 13 is attached to the liquid crystal display panel 12 such that the fourth extension portion 32a of the back light unit 13, located in the second sub FPC 32, faces the first extension portion 30a of the main FPC 30.

Subsequently, as illustrated in FIG. 11 and FIG. 12, the first extension portion 30a of the main FPC 30 and the fourth extension portion 32a of the second sub FPC 32 provided in the back light unit 13 are electrically connected to each other by soldering or the like. Thus, as illustrated in FIG. 12, the electrically connected portions 56 are formed in the first extension portion 30a and the fourth extension portion 32a by soldering or the like.

As illustrated in FIG. 11 and FIG. 13, the second extension portion 30b of the main FPC 30 and the third extension portion 33a of the third sub FPC 33 provided in the light source unit 50 are electrically connected to each other by soldering or the like. Thus, as illustrated in FIG. 13, the electrically connected portions 56 are formed also in the second extension portion 30b and the third extension portion 33a by soldering or the like.

Next, as illustrated in FIG. 14 and FIG. 15, the first and fourth extension portions 30a and 32a which extend outwardly from the side area 5 of the panel laminated body 10 in the short-side direction of the panels 11, 12, and 13, and are electrically connected to each other in a state where the first and fourth extension portions 30a and 32a are superimposed on each other are folded in the side area 5 of the panel laminated body 10. Similarly, the second and third extension portions 30b and 33a are folded in the side area 5 of the panel laminated body 10. In this folding process, as illustrated in FIG. 17, the insulating sheet 54 is interposed between the second extension portion 30b and the third extension portion 33a so as to cover the element 53 mounted on the main FPC 30.

Subsequently, as illustrated in FIG. 16, the folded first and fourth extension portions 30a and 32a and the folded second and third extension portions 30b and 33a are attached and fixed to the main FPC 30 by the insulating tape member 55. Thus, the liquid crystal display device 1 is fabricated.

Advantages of First Embodiment

Therefore, according to the first embodiment, even when the liquid crystal display device 1 includes the panel laminated body 10 in which a plurality of layers of panels, that is, the panels 11, 12, and 13 which include the FPCs 30, 31, and 33, respectively, each of the extension portions 30a and 32a which extend outwardly from the side area 5 of the panel laminated body 10 in the short-side direction of the panels 12 and 13 is formed at least in a part of a corresponding one of the FPCs 30 and 32, at least a pair of extension portions, that is, the first and fourth extension portions 30a and 32a, are electrically connected to each other in a state where the first and fourth extension portions 30a and 32a superimposed on each other, and the first and fourth extension portions 30a and 32a are folded in the side area 5 of the panel laminated body 10. Thus, the plurality of FPCs may be compactly disposed in the side area 5 of the panel laminated body 10 so as not to be superimposed on the panel laminated body 10.

As a result, even when the number of the FPCs increases as the number of panels increases, the thickness of the entire liquid crystal display device 1 may be reduced. Furthermore, the plurality of FPCs, that is, the FPCs 30 and 32, are electrically connected directly to each other in the first and fourth extension portions 30a and 32a without a connector interposed therebetween, and thus, the number of connectors may be reduced. Therefore, the space for connecters and the component cost may be greatly reduced.

Furthermore, since the first and second sub FPCs 31 and 32 are directly connected to the main FPC 30, connectors for the first and second sub FPCs 31 and 32 may be omitted and a single connecter 35 of the main FPC 30 may be shared by the FPCs 30, 31, and 32.

Also, the FPCs 30, 31, and 32, and the extension portions 30a and 32a and the tip end portion 31a thereof may be arranged in an area in which the side end portion 40a of the substrate member 40 is disposed, and thus, the space may be effectively used, resulting in reduction in a non-display area of the liquid crystal display device 1.

Moreover, not only for the FPCs 30 and 32 in the panel laminated body 10, but also for the third sub FPC 33 provided in the substrate member 40, the extension portions 30b and 33a are connected to each other, and thus, a circuit configuration of the light source unit 50 or the like may be provided in the side end portion 40a of the substrate member 40 while the space in the side area 5 of the panel laminated body 10 is effectively used.

Furthermore, the base-end side portions of the extension portions 30a, 30b, and 32a are separated from the side portion of the panel laminated body 10 in a state before the extension portions 30a, 30b, 32a, and 33a of the main FPC 30, the second sub FPC 32, and the third sub FPC 33 are folded, and thus, in fabrication process steps for fabricating the liquid crystal display device 1, the side portion of the panel laminated body 10 may be held in a simple manner by another holding section.

The insulating sheet is interposed between the elements 53 of the main FPC 30 and the folded extension portions 30b and 33a, and thus, the elements 53 may be electrically protected and be physically protected from contact by the extension portions 30b and 33a.

Furthermore, the electrically connected portions 56 of the extension portions 30a, 30b, 32a, and 33a may be reliably protected by the insulating tape member 55 and the extension portions 30a, 30b, 32a, and 33a may be fixed to the main FPC 30 in a state where the extension portions 30a, 30b, 32a, and 33a are folded, and thus, the reliability of the liquid crystal display device 1 may be increased.

Second Embodiment

FIGS. 18-26 illustrate a second embodiment.

Figure 18:
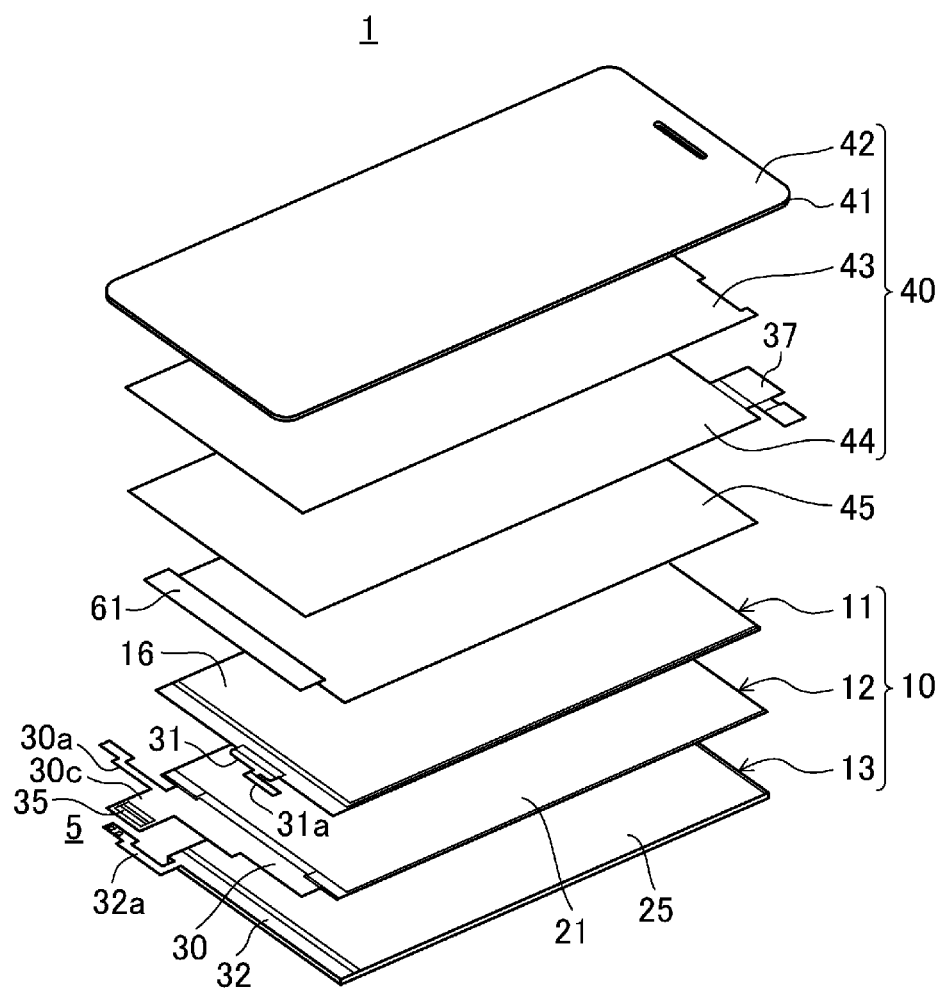
FIG. 18 is a perspective view illustrating a structure of a major part of a liquid crystal display device according to a second embodiment.
Figure 19:
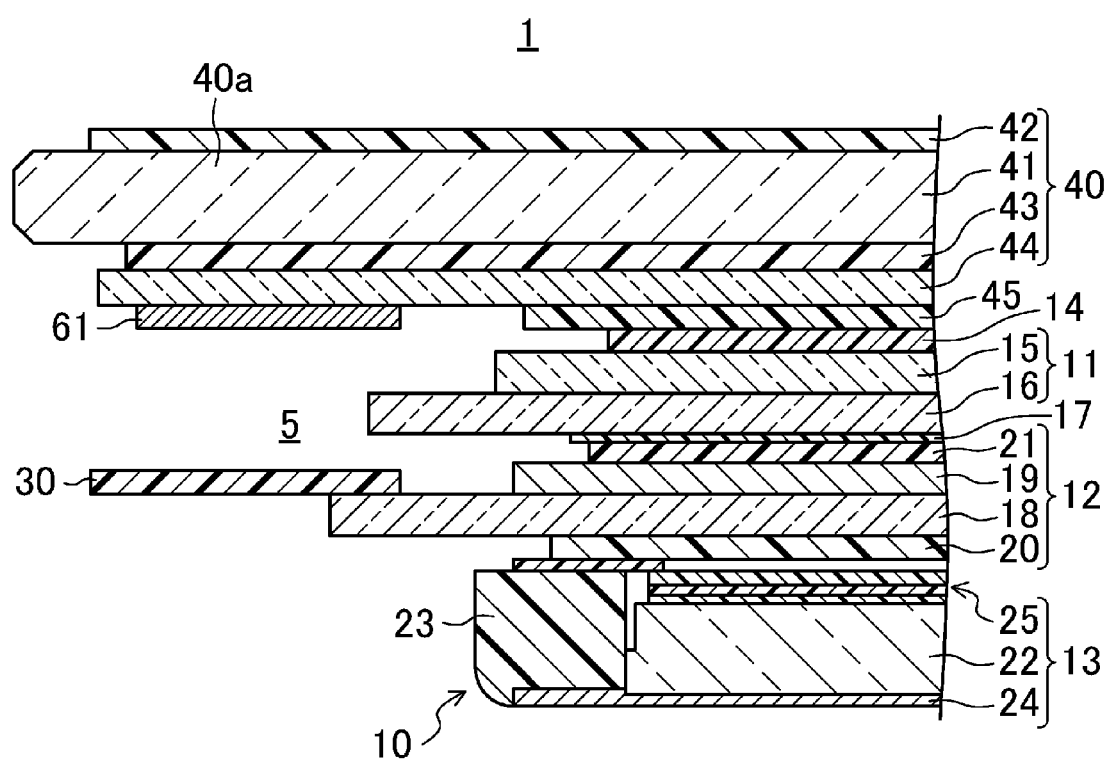
FIG. 19 is an enlarged cross-sectional view illustrating a side portion of the liquid crystal display device.
Figure 25:
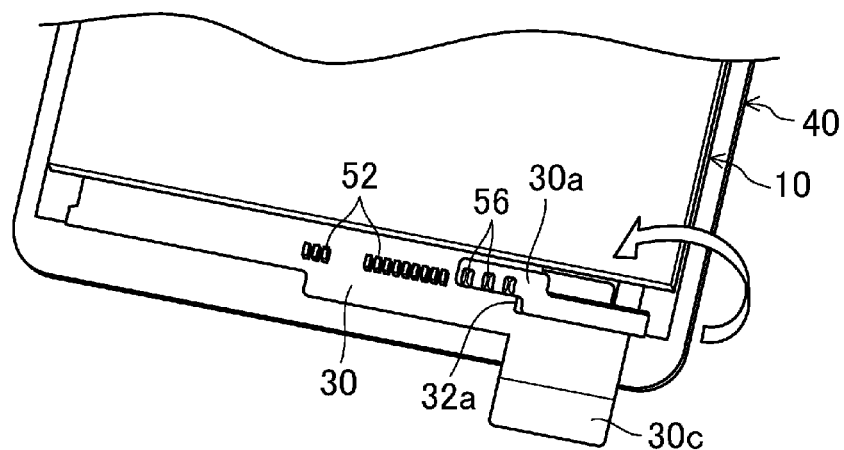
FIG. 25 is a perspective view illustrating a liquid crystal display device in which extension portions are folded.
Figure 26:
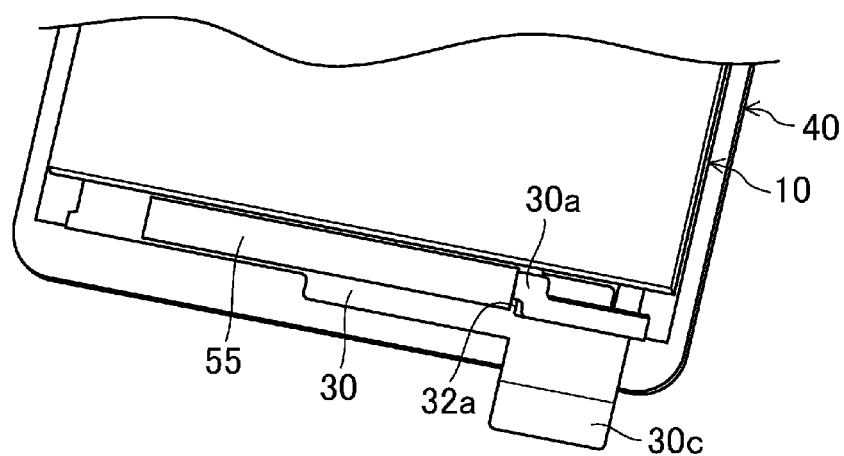
FIG. 26 is a perspective view illustrating an insulating tape member which fixes extension portions.

FIG. 18 is a perspective view illustrating a structure of a major part of a liquid crystal display device 1 according to a second embodiment. FIG. 19 is an enlarged cross-sectional view illustrating a side portion of the liquid crystal display device 1. FIG. 25 is a perspective view illustrating the liquid crystal display device 1 in which extension portions 30a and 32a are folded. FIG. 26 is a perspective view illustrating an insulating tape member 55 which fixes the extension portions 30a and 32a.

Note that, in each of the following embodiments, each of the same parts as those illustrated in FIGS. 1-17 is denoted by the same reference character, and therefore, the detail description thereof will be partially omitted.

As illustrated in FIGS. 18 and 19, the liquid crystal display device 1 according to the second embodiment includes a panel laminated body 10 and a substrate member 40 stacked on the panel laminated body 10.

Panel Laminated Body

Similar to the first embodiment, the panel laminated body 10 includes a SW panel 11, a liquid crystal display panel 12, and a back light unit 13, which are stacked together. As illustrated in FIG. 18, each of FPCs 30, 31, and 32, which are flexible printed circuit boards, is connected to a corresponding one of respective short sides of the rectangular panels 11, 12, and 13 disposed in one of side portions of the panel laminated body 10.

Each of the SW panel 11, the liquid crystal display panel 12, and the back light unit 13 has the same structure as a corresponding one of the structures thereof described in the first embodiment 1.

That is, the main FPC 30 is connected to a short-side area of the liquid crystal display panel 12. As illustrated in FIG. 18, the main FPC 30 includes a first extension portion 30a which extends outwardly from the side area 5 of the panel laminated body 10 in a short-side direction of the liquid crystal display panel 12 in the side area 5. Furthermore, the main FPC 30 includes a tip end portion 30c which is located in the side area 5 of the panel laminated body 10 and protrudes in a long-side direction of the liquid crystal display panel 12. A connector 35 including a connection terminal is provided in the tip end portion 30c.

To a short-side area of the SW panel 11, connected is a first sub FPC 31 including a tip end portion 31a extending in a short-side direction of the SW panel 11. The tip end portion 31a is disposed in the side area 5 of the panel laminated body 10 and is electrically connected to the main FPC 30 by soldering or the like.

A second sub FPC 32 is connected to a short-side area of the back light unit 13. As illustrated in FIG. FIG. 18, the second sub FPC 32 includes a fourth extension portion 32a which extends outwardly from the side area 5 of the panel laminated body 10 in a short-side direction of the back light unit 13. In a state where the fourth extension portion 32a is superimposed on the first extension portion 30a of the main FPC 30, the fourth extension portion 32a is electrically connected to the first extension portion 30a by soldering or the like and, as illustrated in FIG. 25 and FIG. 26, is folded in the side area 5 of the panel laminated body 10.

Substrate Member

As illustrated in FIG. 18, the substrate member 40 includes a cover substrate 41 to which a protective film 42 is attached and a touch panel 44 attached to the cover substrate 41 with a resin film 43 interposed therebetween. The substrate member 40 is attached to the SW panel 11 of the panel laminated body 10 with a resin film 45 interposed therebetween such that a side of the substrate member 40 on which the touch panel 44 is provided faces the SW panel 11.

The cover substrate 41 is made of, for example, a glass substrate or the like. An FPC 37 used for transmitting a control signal and the like to the touch panel 44 is connected to a short side of the touch panel 44 located at an opposite side to a side at which the side area 5 of the panel laminated body 10 is provided.

As illustrated in FIG. 19, the substrate member 40 includes a side end portion 40a protruding beyond the panel laminated body 10 at the side at which the side area 5 of the panel laminated body 10 is provided. The side end portion 40a includes a short-side area of each of the cover substrate 41 and the touch panel 44. A light shielding film (not illustrated) is formed on the cover substrate 41 of the side end portion 40a, and a plurality of icons (not illustrated) used for operating the liquid crystal display device 1 are formed by a pattern which transmits light.

As illustrated in FIG. 19, a reflection plate 61 is provided in the side end portion 40a of the substrate member 40. The reflection plate 61 which reflects incident light from the cover substrate 41 side to reflection-display the plurality of icons is attached to an opposite surface of the touch panel 44 to a surface thereof which faces the cover substrate 41. The reflection plate 61 is formed to have a slip-like shape extending in the short-side direction of the substrate member 40.

Thus, the liquid crystal display device 1 is configured such that control signals of a plurality of types are input and output from and to the connector 35 of the main FPC 30 to thereby control all of the back light unit 13, the liquid crystal display panel 12, and the SW panel 11.

That is, a control signal and the like are supplied to the back light unit 13 from the connector 35 through the main FPC 30 and the second sub FPC 32. Also, a control signal and the like are supplied to the liquid crystal display panel 12 from the connector 35 through the main FPC 30. A control signal and the like are supplied to the SW panel 11 through the main FPC 30 and the first sub FPC 31.

When a user touches an icon reflection-displayed, a touch position of the user then is detected by the touch panel.

Fabrication Method

Next, a method for fabricating the liquid crystal display device 1 will be described.

Figure 20:
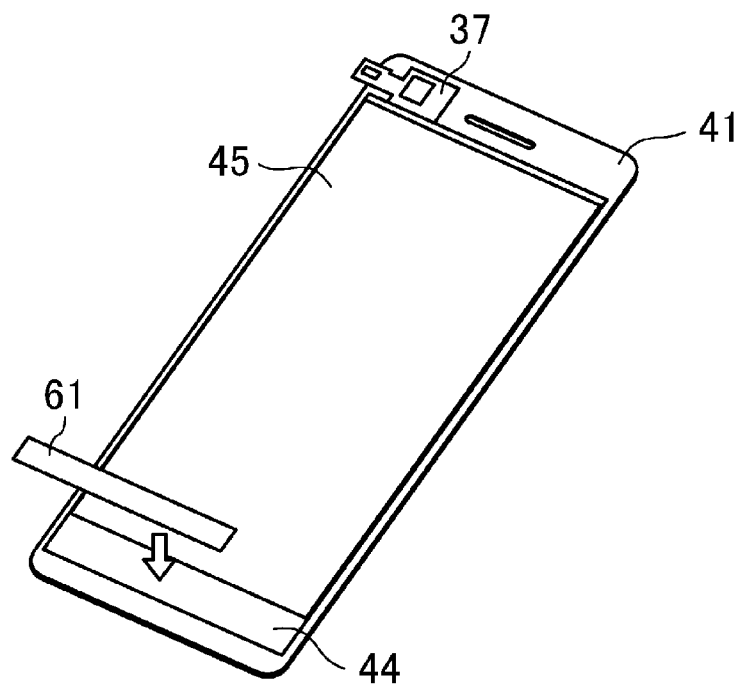
FIG. 20 is a perspective view illustrating a reflection plate and a cover substrate.
Figure 21:
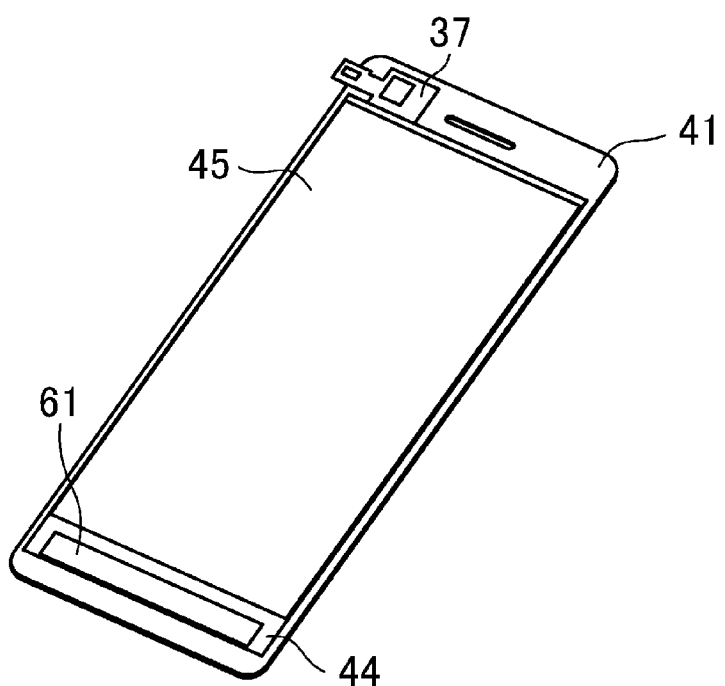
FIG. 21 is a perspective view illustrating a reflection plate attached to a cover substrate.
Figure 22:
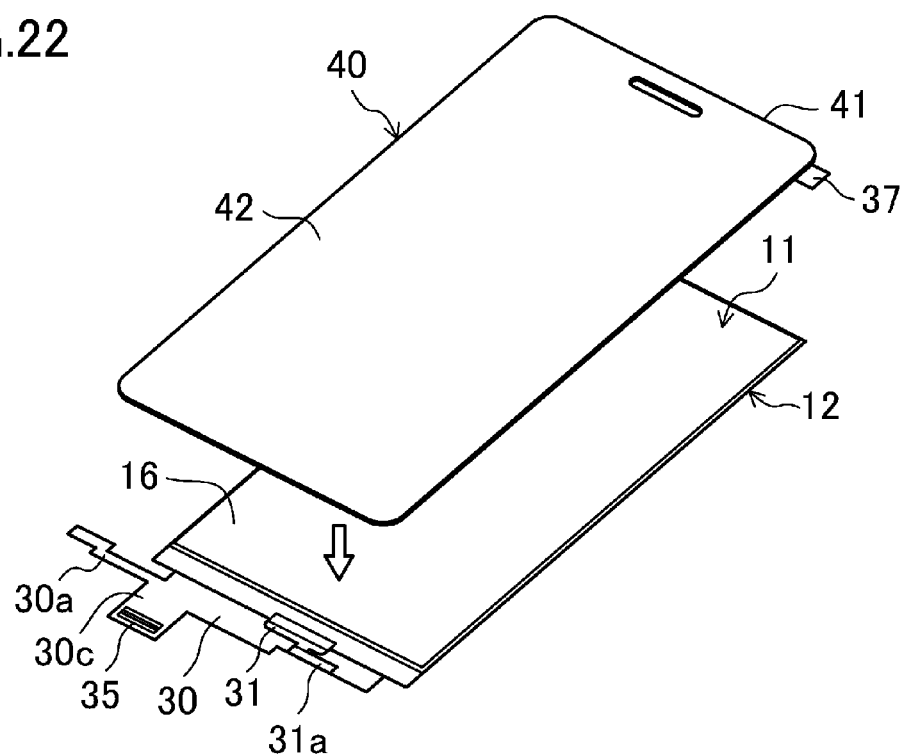
FIG. 22 is a perspective view illustrating a substrate member, an SW panel, and a liquid crystal display panel.
Figure 23:
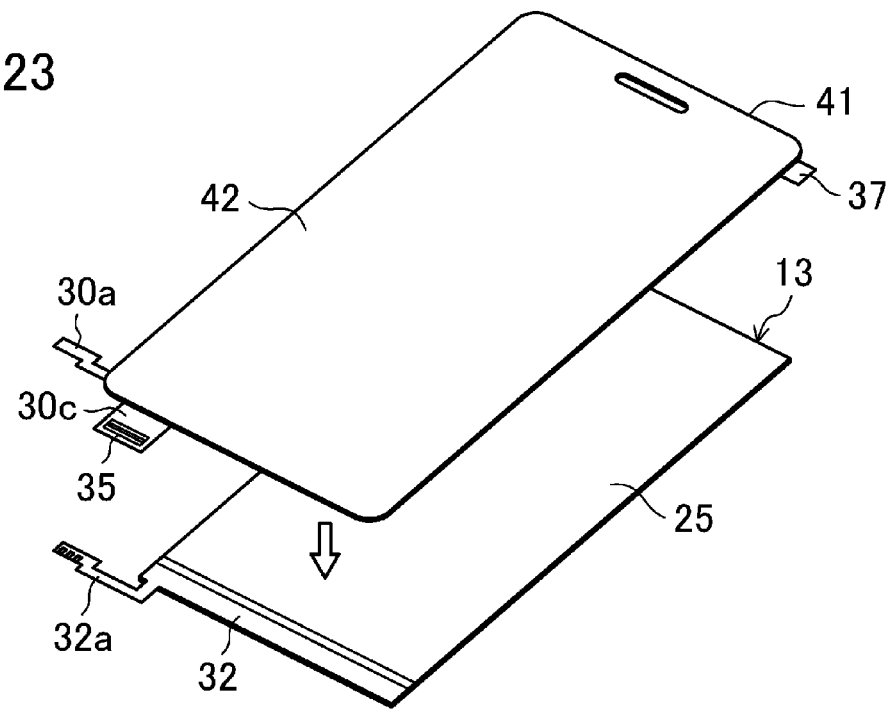
FIG. 23 is a perspective view illustrating a substrate member on which an SW panel and a liquid crystal display panel are superimposed, and a back light unit.
Figure 24:
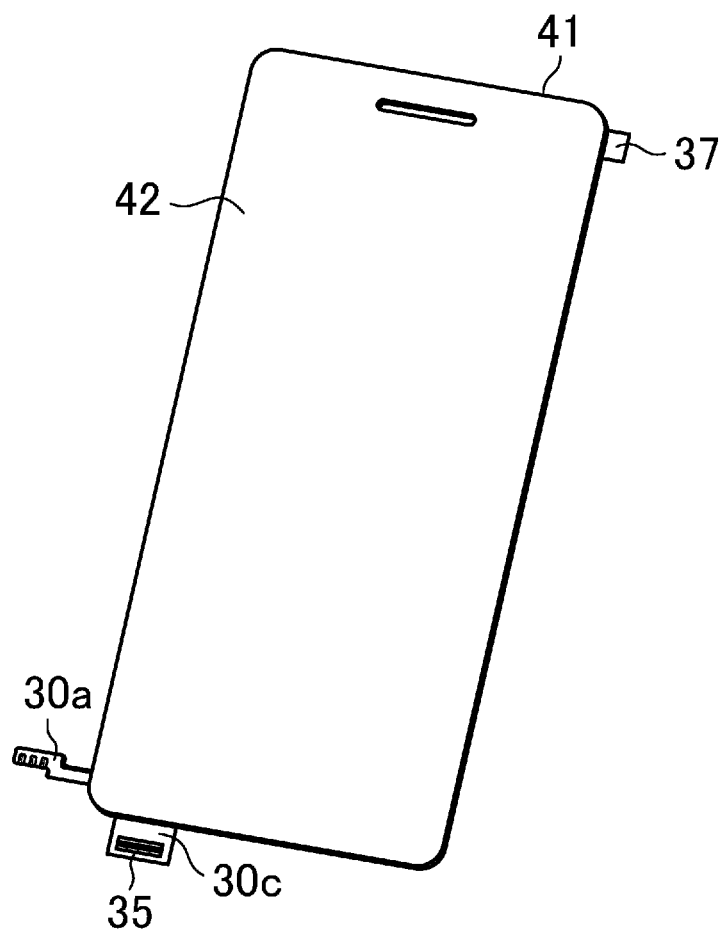
FIG. 24 is a perspective view illustrating a substrate member on which a back light unit is superimposed.

FIG. 20 is a perspective view illustrating the reflection plate 61 and the signal line 41. FIG. 21 is a perspective view illustrating the reflection plate 61 attached to the cover substrate 41. FIG. 22 is a perspective view illustrating the substrate member 40, the SW panel 11, and the liquid crystal display panel 12. FIG. 23 is a perspective view illustrating the substrate member 40 on which the SW panel 11 and the liquid crystal display panel 12 are superimposed, and the back light unit 13. FIG. 24 is a perspective view illustrating the substrate member 40 on which the back light unit 13 is superimposed.

First, similar to the first embodiment, the SW panel 11 to which the first sub FPC 31 is connected is attached to the liquid crystal display panel 12 to which the main FPC 30 is connected. Subsequently, the tip end portion 31*a* of the first sub FPC 31 in the SW panel 11 is electrically connected to the main FPC 30 by soldering or the like.

The cover substrate 41 and the touch panel 44 are attached with each other with the resin film 43 interposed therebetween. The protective film 42 is attached to the cover substrate 41 in advance. Next, the resin film 45 is attached to the touch panel 44 attached to the cover substrate 41. The resin film 45 is shorter than the touch panel 44 in a long-side direction of the resin film 45. Therefore, as illustrated in FIG. 20, in an area of the substrate member 40 which is to be the side end portion 40*a*, one of short-side areas of the touch panel 44 is exposed from the resin film 45. Thereafter, as illustrated in FIG. 21, the reflection plate 61 is attached to the exposed area of the touch panel 44 from the resin film 45. Thus, the substrate member 40 is formed.

Next, as illustrated in FIG. 22, the substrate member 40 is attached to the SW panel 11 attached to the liquid crystal display panel 12. Subsequently, as illustrated in FIG. 23, the SW panel 11 and the liquid crystal display panel 12 which are attached to the substrate member 40 and the back light unit 13 to which the second sub FPC 32 is connected are attached to each other. In the attaching process, the back light unit 13 is attached to the liquid crystal display panel 12 such that the fourth extension portion 32*a* of the back light unit 13, located in the second sub FPC 32, faces the first extension portion 30*a* of the main FPC 30.

Next, as illustrated in FIG. 24, the first extension portion 30*a* of the main FPC 30 and the fourth extension portion 32*a* of the second sub FPC 32 provided in the back light unit 13 are electrically connected to each other by soldering or the like. Thus, electrically connected portions 56 are formed in the first extension portion 30*a* and the fourth extension portion 32*a* by soldering or the like.

Next, as illustrated in FIG. 25, the first and fourth extension portions 30*a* and 32*a* which extend outwardly from the side area 5 of the panel laminated body 10 in the short-side direction of the panels 11, 12, and 13 in the side area 5, and are electrically connected to each other in a state where the first and fourth extension portions 30*a* and 32*a* are superimposed on each other are folded in the side area 5 of the panel laminated body 10.

Subsequently, as illustrated in FIG. 26, the folded first and fourth extension portions 30*a* and 32*a* are attached and fixed to the main FPC 30 by the insulating tape member 55. Thus, the liquid crystal display device 1 is fabricated.

Advantages of Second Embodiment

Therefore, according to the second embodiment, similar to the first embodiment, each of the extension portions 30*a* and 32*a* which extend outwardly from the side area 5 of the panel laminated body 10 in the short-side direction of the panels 12 and 13 is formed in a corresponding one of the FPCs 30 and 32, and the first and fourth extension portions 30*a* and 32*a* are electrically connected to each other in a state where the first and fourth extension portions 30*a* and 32*a* are superimposed on each other and are folded in the side area 5 of the panel laminated body 10. Thus, a plurality of FPCs may be compactly disposed in the side area 5 of the panel laminated body 10 so as not to be superimposed on the panel laminated body 10.

As a result, even when the number of the FPCs increases as the number of panels increases, the thickness of the entire liquid crystal display device 1 may be reduced. Furthermore, the plurality of FPCs, that is, the FPCs 30 and 32, are electrically connected directly to each other in the first and fourth extension portions 30*a* and 32*a* without a connector interposed therebetween, and thus, the number of connectors may be reduced. Therefore, the space for connecters and the component cost may be greatly reduced.

Furthermore, since the first and second sub FPCs 31 and 32 are directly connected to the main FPC 30, a single connecter 35 of the main FPC 30 may be shared by the FPCs 30, 31, and 32. Also, the FPCs 30, 31, and 32 and the extension portions 30*a* and 32*a* and the tip end portion 31*a* thereof may be arranged in an area in which the side end portion 40*a* of the substrate member 40 is disposed, and thus, the space may be effectively used, resulting in reduction in a non-display area of the liquid crystal display device 1.

Furthermore, the base-end side portions of the extension portions 30*a* and 32*a* are separated from the side portions of the panel laminated body 10 in a state before the extension portions 30*a* and 33*a* of the main FPC 30 the second sub FPC 32 are folded, and thus, in fabrication process steps for fabricating the liquid crystal display device 1, the side portions of the panel laminated body 10 may be held in a simple manner by another holding section.

Furthermore, the electrically connected portions 56 of the extension portions 30*a* and 32*a* may be realizably protected by the insulating tape member 55 and the extension portions 30*a* and 32*a* may be fixed to the main FPC 30 in a state where the extension portions 30*a*, 30*b*, 32*a*, and 33*a* are folded, and thus, the reliability of the liquid crystal display device 1 may be increased.

Third Embodiment

Figure 27:
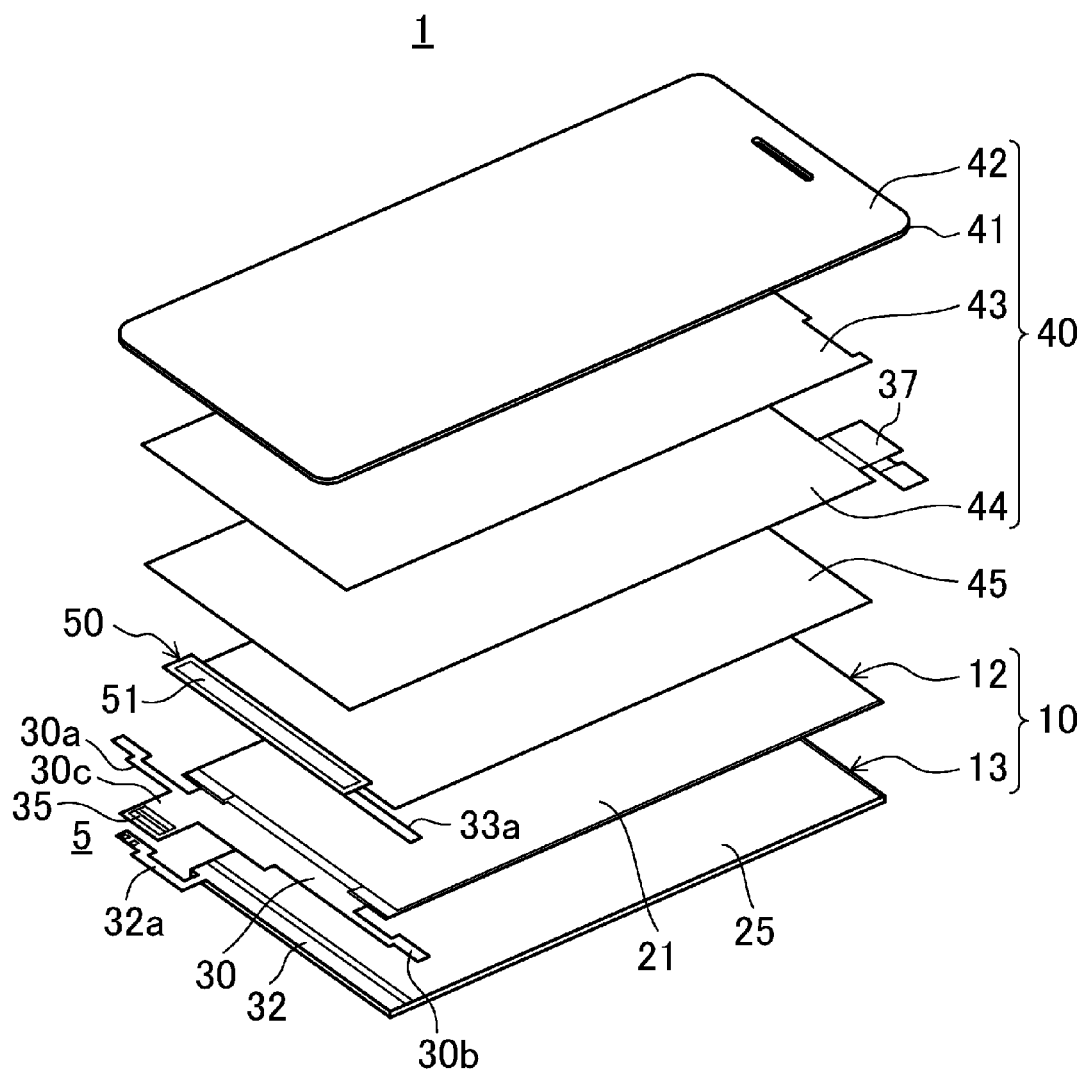
FIG. 27 is a perspective view illustrating a structure of a major part of a liquid crystal display device according to a third embodiment.

FIG. 27 illustrates a third embodiment.

FIG. 27 is a perspective view illustrating a structure of a major part of a liquid crystal display device 1 according to the third embodiment.

In the first embodiment, the panel laminated body 10 includes the SW panel 11, the liquid crystal display panel 12, and the back light unit 13. However, the panel laminated body 10 may be configured, as a simple structure in which the SW panel 11 is not provided, so as to include the liquid crystal display panel 12 and the back light unit 13.

That is, the liquid crystal display device 1 according to the third embodiment does not include the SW panel 11 and, in this point, is different from the liquid crystal display device 1 according to the first embodiment. A second sub FPC 32 of a back light unit 13 and a third sub FPC 33 of a light source unit 50 are connected to a main FPC 30 of a liquid crystal display panel 12 according to the third embodiment.

Therefore, in this embodiment, a fourth extension portion 32a provided in the second sub FPC 32 of the back light unit 13 is electrically connected to a first extension portion 30a provided in the main FPC 30, and a third extension portion 33a provided in the third sub FPC 33 of the light source unit 50 is electrically connected to a second extension portion 30b provided in the FPC 30. Each of the extension portions 30a, 30b, 32a, and 33a is folded in a side area 5 of the panel laminated body 10. Thus, in this embodiment, whether or not the number of FPCs increases, the thickness of the entire liquid crystal display device 1 may be also reduced, and similar advantages to those of the first embodiment may be achieved.

Other Embodiments

In the third embodiment, the structure obtained by forming the structure of the first embodiment such that the SW panel 11 is not provided has been described. However, in the structure of the third embodiment, instead of the light source unit 50, the reflection plate 61 of the second embodiment may be provided. Even when this structure is employed, whether or not the number of FPCs increases, the thickness of the entire liquid crystal display device 1 may be also reduced.

In each of the first to third embodiments, as an example of a display device according to the present disclosure, the liquid crystal display device 1 has been described. However, the technology according to the present disclosure may be applied to other flat display devices, such as an organic EL display device and the like, in a similar manner.

In each of the first to third embodiments, it has been described that a light shielding film is formed in the cover substrate 41 in the side end portion 40a of the substrate member 40 and a plurality of icons which transmit light are formed in the light shielding film. Examples of the light shielding film herein include a film which substantially completely shields light emitted thereto and a film which shields a part of light emitted thereto and transmits other part of light.

The present disclosure is not limited to the first to third embodiments, but includes structures obtained by combining, as appropriate, the first to third embodiments.

INDUSTRIAL APPLICABILITY

As has been described above, the technology disclosed herein is useful for a flat display device, such as, for example, a liquid crystal display device.

DESCRIPTION OF REFERENCE CHARACTERS

1 Liquid crystal display device
5 Side area
10 Panel laminated body
11 SW panel (panel)
12 Liquid crystal display panel (panel)
13 Back light unit (panel)
30 Main FPC
30a First extension portion
30b Second extension portion
31 First sub FPC
32 Second sub FPC
32a Fourth extension portion
33 Third sub FPC (substrate member side flexible printed circuit board)
33a Third extension portion (substrate member side extension portion)
35 Connector
40 Substrate member
40a Side end portion
50 Light source unit
53 Element
54 Insulating sheet (insulating member)
55 Insulating tape member
56 Electrically connected portion

The invention claimed is:

1. A display device, comprising:
a panel laminated body including a plurality of rectangular panels stacked together such that respective short sides of the plurality of panels extend in a same direction;
flexible printed circuit boards each being connected to a corresponding one of respective short sides of the plurality of panels disposed in one of side portions of the panel laminated body;
an extension portion formed in at least a part of the flexible printed circuit boards so as to extend outwardly from a side area of the panel laminated body in a short-side direction of the panels in the side area; and
a substrate member stacked on the panel laminated body and including a side end portion protruding from the side area of the panel laminated body; wherein
at least a pair of the extension portions is electrically connected together in a state where the pair of the extension portions is superimposed on each other and is folded in the side area of the panel laminated body;
one extension portion in the pair of extension portions is folded inside of another extension portion in the pair of extension portions;
the extension portions of the flexible printed circuit boards are disposed such that the extension portions as a whole superpose on the side end portion of the substrate member;
a substrate member side flexible printed circuit board including, a substrate member side extension portion extending outwardly from the side area of the panel laminated body in short-side direction of the panels in the side area is provided in the side end portion of the substrate member, and
the substrate member side extension portion is electrically connected to the extension portions of the flexible printed circuit boards in a state where the substrate member side extension portion is superimposed on the extension portions, and is folded in the side area of the panel laminated body.

2. The display device of claim 1, wherein
the plurality of flexible printed circuit boards include a main flexible printed circuit board including a connector, and at least one sub flexible printed circuit board which does not include a connector, and an extension portion of the sub flexible printed circuit board is electrically connected to an extension portion of the main flexible printed circuit board.

3. The display device of claim 1, wherein the extension portions of the flexible printed circuit boards are formed such that each of base-end side portions of the extension portions is separated from the side portion of the panel laminated body in which the flexible printed circuit boards are provided with a more distance, as compared to a corresponding tip-end side portion thereof.

4. The display device of claim 1, wherein an element is provided in each of areas of the flexible printed circuit boards which are superimposed on the folded extension portions, and an insulating member is interposed between the element and the folded extension portions.

5. The display device of claim 1, wherein the folded extension portions are fixed to the flexible printed circuit boards by an insulating tape member which covers electrically connected portions of the extension portions.

* * * * *